(12) United States Patent
Ichino et al.

(10) Patent No.: US 10,807,027 B2
(45) Date of Patent: Oct. 20, 2020

(54) TREATMENT SOLUTION SUPPLY APPARATUS AND SUBSTRATE TREATMENT SYSTEM

(71) Applicant: Tokyo Electron Limited, Tokyo (JP)

(72) Inventors: Katsunori Ichino, Koshi (JP); Tsunenaga Nakashima, Koshi (JP); Hideo Funakoshi, Koshi (JP); Nobuaki Matsuoka, Koshi (JP); Masayuki Kajiwara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 21 days.

(21) Appl. No.: 16/117,664

(22) Filed: Aug. 30, 2018

(65) Prior Publication Data
US 2019/0076763 A1 Mar. 14, 2019

(30) Foreign Application Priority Data
Sep. 11, 2017 (JP) .................. 2017-174298

(51) Int. Cl.
| | |
|---|---|
| *B01D 36/00* | (2006.01) |
| *B01D 35/26* | (2006.01) |
| *B05C 11/10* | (2006.01) |
| *B05C 5/00* | (2006.01) |
| *G03F 7/20* | (2006.01) |
| *H01L 21/67* | (2006.01) |
| *G03F 7/30* | (2006.01) |
| *G03F 7/16* | (2006.01) |
| *H01L 21/027* | (2006.01) |

(52) U.S. Cl.
CPC .......... *B01D 36/001* (2013.01); *B01D 35/26* (2013.01); *B05C 5/004* (2013.01); *B05C 11/10* (2013.01); *G03F 7/162* (2013.01); *G03F 7/3021* (2013.01); *G03F 7/70875* (2013.01); *H01L 21/6715* (2013.01); *H01L 21/67017* (2013.01); *H01L 21/67178* (2013.01); *H01L 21/0276* (2013.01)

(58) Field of Classification Search
None
See application file for complete search history.

(56) References Cited

U.S. PATENT DOCUMENTS

| | | | | |
|---|---|---|---|---|
| 5,134,962 A | * | 8/1992 | Amada | ............... H01L 21/6715 118/688 |
| 2014/0174475 A1 | * | 6/2014 | Takayanagi | ....... H01L 21/67017 134/18 |

FOREIGN PATENT DOCUMENTS

JP 11-204416 A 7/1999

* cited by examiner

*Primary Examiner* — Jethro M. Pence
(74) *Attorney, Agent, or Firm* — Posz Law Group, PLC

(57) ABSTRACT

A treatment solution supply apparatus to supply a treatment solution to a treatment solution discharge unit via a supply path that is provided with a filter configured to remove foreign substances in the treatment solution and a tubephragm pump to send the treatment solution, the supply path has an opening/closing valve on an upstream side of the tubephragm pump and the filter, and a suck-back valve on a downstream side of the tubephragm pump and the filter, and includes a control unit to control at least the tubephragm pump, the opening/closing valve, and the suck-back valve, wherein the control unit performs: a control of stopping sending of the treatment solution from the tubephragm pump; and a control of suspending discharge of the treatment solution from the treatment solution discharge unit by operation of the suck-back valve, and then closing the opening/closing valve to stop the discharge.

10 Claims, 10 Drawing Sheets

(A)          (B)

(C)          (D)

TREATMENT SOLUTION SUPPLY APPARATUS AND SUBSTRATE TREATMENT SYSTEM

CROSS REFERENCE TO RELATED APPLICATIONS

This application is based upon and claims the benefit of priority of the prior Japanese Patent Application No. 2017-174298, filed in Japan on Sep. 11, 2017, the entire contents of which are incorporated herein by reference.

BACKGROUND OF THE INVENTION

1. Field of the Invention

The present invention relates to a treatment solution supply apparatus and a substrate treatment system which supply a treatment solution such as a resist solution to a treatment solution discharge unit which discharges the treatment solution to a treatment body.

2. Description of the Related Art

In a photolithography step in a manufacturing process of a semiconductor device or the like, a treatment solution such as a resist solution, a developing solution or the like is used for forming a coating film such as an anti-reflection film or a resist film on a treatment body such as a semiconductor wafer (hereinafter, referred to as a "wafer"), or for developing the resist film after exposure.

In this treatment solution, foreign substances (particles) are sometimes included. For this reason, a filter is provided in a treatment solution supply apparatus, and the filter removes the particles (refer to Japanese Laid-open Patent Publication No. H11-204416).

The treatment solution supply apparatus further includes a sending pump which sends the treatment solution to a treatment solution coating nozzle. Further, a dispense valve is provided downstream of the sending pump for the purpose of adjusting the discharge timing of the treatment solution from the treatment solution coating nozzle and improving the liquid draining property at the treatment solution coating nozzle because there is a delay in a drive operation of driving the sending pump and in a discharge operation from the treatment solution coating nozzle (refer to Japanese Laid-open Patent Publication No. H11-204416).

For example, in the treatment solution supply apparatus in Japanese Laid-open Patent Publication No. H11-204416, an opening/closing valve and a suck-back valve adjacently arranged are used as the dispense valve. Note that in the treatment solution supply apparatus in Patent Document 1, a filter is integrally provided at the sending pump having the dispense valve provided downstream, in other words, the dispense valve is provided downstream of the filter.

SUMMARY OF THE INVENTION

However, for the opening/closing valve included in the dispense valve, high cleanliness is ensured but a structure of opening/closing the flow path of the treatment solution is adopted, so that fine foreign substances may be generated. For example, in the opening/closing valve, the above fine foreign substances may occur at a contact surface between an opening/closing member which opens/closes the flow path and the flow path. The foreign substances generated in the opening/closing valve cannot be removed by the filter in the configuration where the opening/closing valve is provided downstream of the filter as in Japanese Laid-open Patent Publication No. H11-204416, possibly bringing about a problem when miniaturization of the semiconductor device further proceeds.

A technology relating to this disclosure has been made in consideration of the above points, and provides a treatment solution supply apparatus capable of supplying a treatment solution with less foreign substances.

An aspect of the technology according to this disclosure is a treatment solution supply apparatus configured to supply a treatment solution to a treatment solution discharge unit via a supply path, the supply path being provided with a filter configured to remove foreign substances in the treatment solution and a tubephragm pump configured to send the treatment solution, the supply path being provided with an opening/closing valve on an upstream side of the tubephragm pump and the filter, and a suck-back valve on a downstream side of the tubephragm pump and the filter, the treatment solution supply apparatus including a control unit configured to control at least the tubephragm pump, the opening/closing valve, and the suck-back valve, wherein the control unit is configured to perform: a control of stopping sending of the treatment solution from the tubephragm pump; and a control of suspending discharge of the treatment solution from the treatment solution discharge unit by operation of the suck-back valve, and then closing the opening/closing valve to stop the discharge.

According to an aspect of the technology relating to this disclosure, it is possible to supply a treatment solution with less foreign substances.

DETAILED DESCRIPTION OF THE INVENTION

Hereinafter, embodiments of the present invention will be described. Note that in this specification and the drawings, the same codes are given to components having substantially the same functional configurations to omit duplicated description.

First Embodiment

Figure 1:
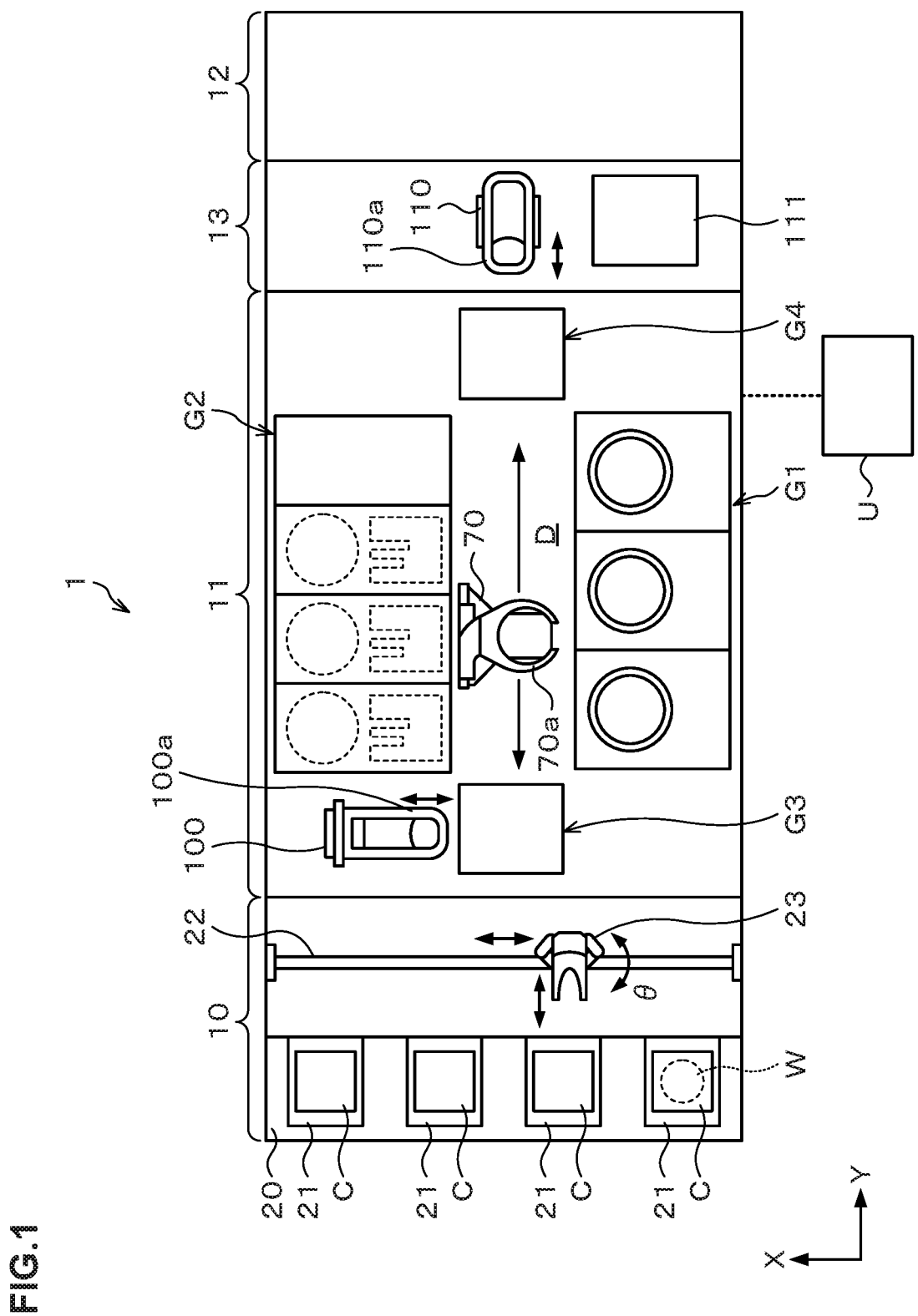
FIG. 1 is a plan view illustrating the outline of the configuration of a substrate treatment system according to this embodiment.
Figure 2:
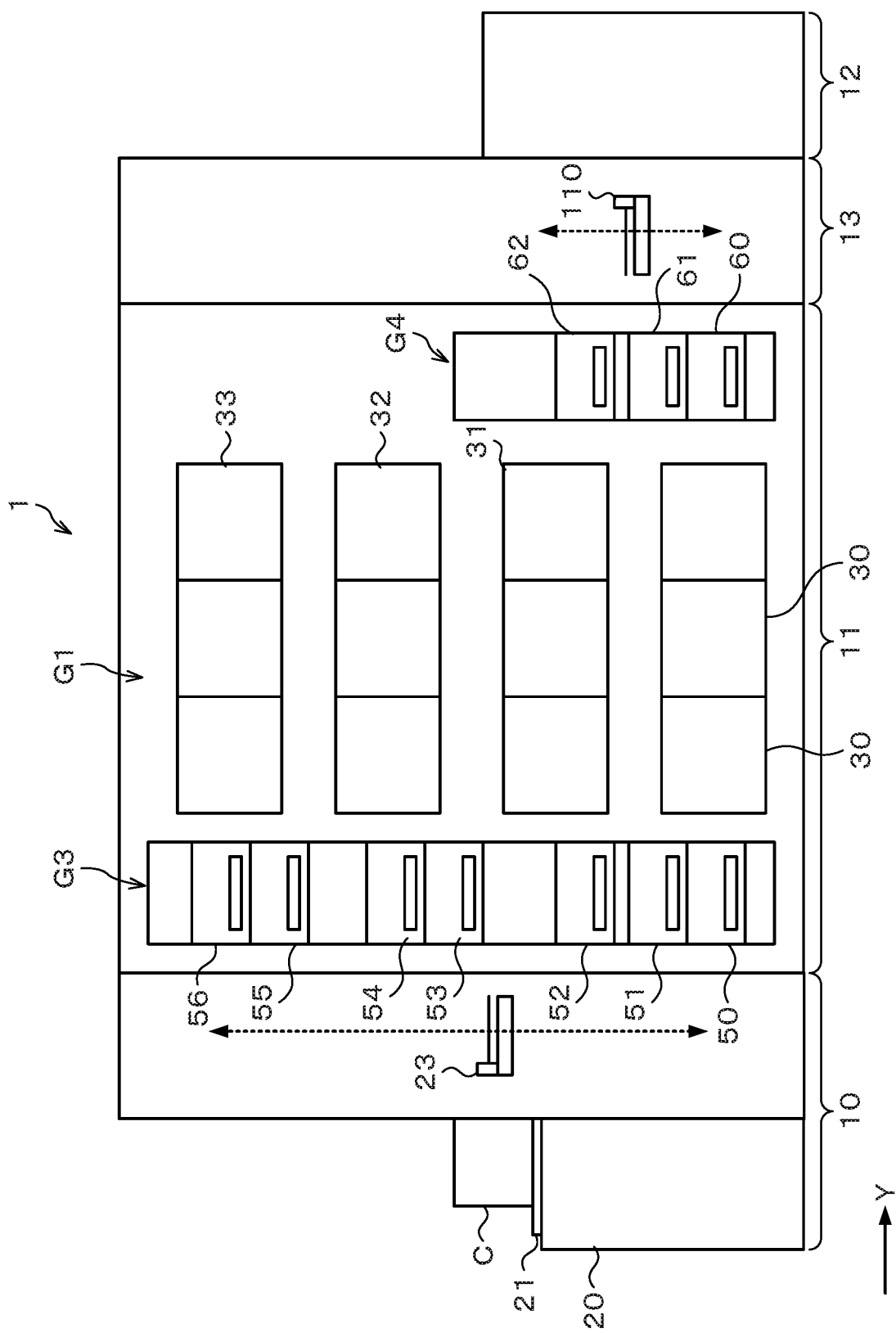
FIG. 2 is a front view illustrating the outline of the configuration of the substrate treatment system according to this embodiment.
Figure 3:
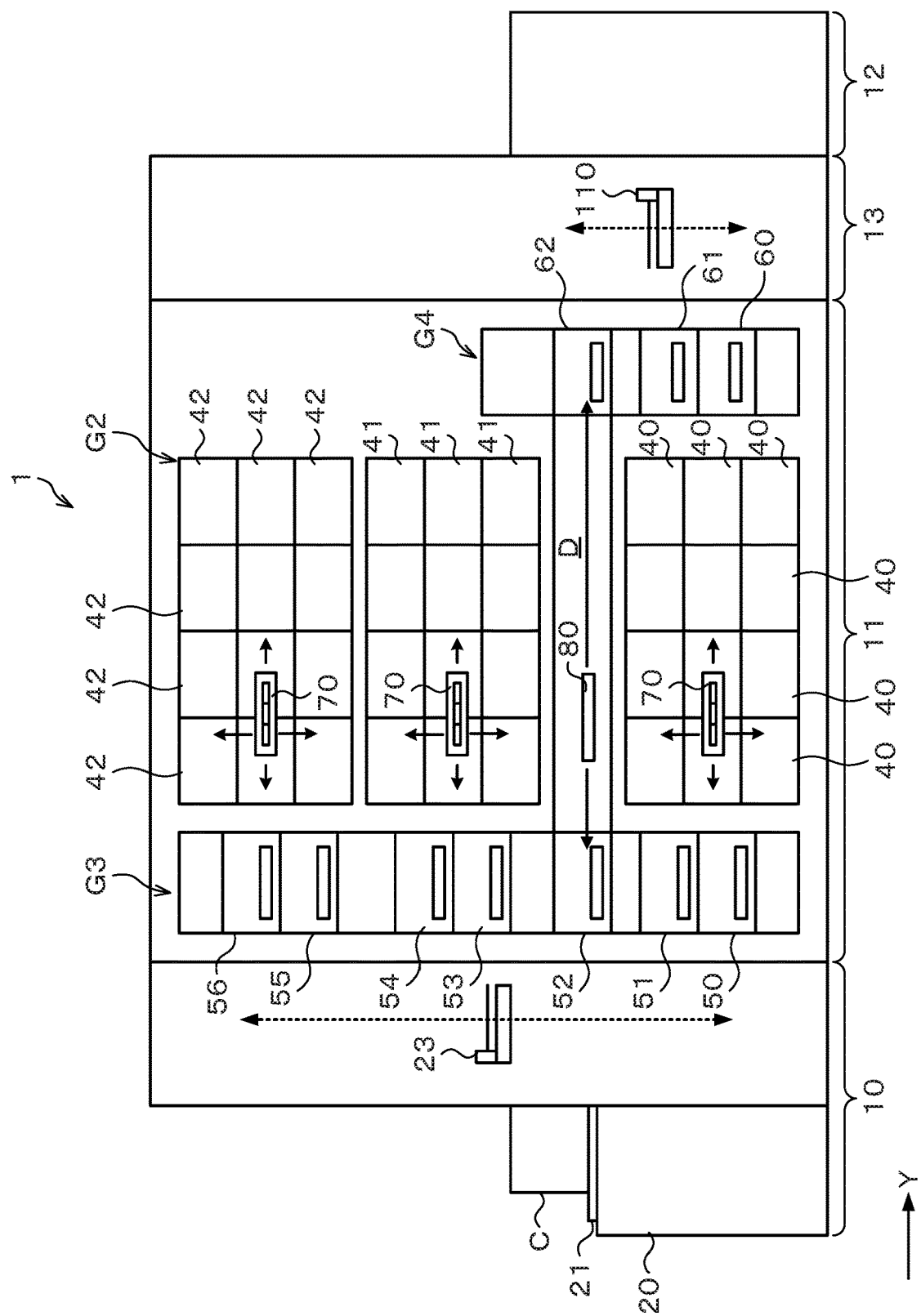
FIG. 3 is a rear view illustrating the outline of the configuration of the substrate treatment system according to this embodiment.

FIG. 1 is an explanatory view illustrating the outline of the configuration of a substrate treatment system 1 equipped with a resist solution supply apparatus as a treatment solution supply apparatus according to a first embodiment. FIG. 2 and FIG. 3 are a front view and a rear view schematically illustrating the outline of the internal configuration of the substrate treatment system 1, respectively.

The substrate treatment system 1 has, as illustrated in FIG. 1, a configuration in which a cassette station 10 into/out of which a cassette C housing a plurality of wafers W is transferred, a treatment station 11 which includes a plurality of various treatment apparatuses performing predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of coating treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution to the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in this order from the bottom.

For example, the developing treatment apparatus 30, the lower anti-reflection film forming apparatus 31, the resist coating apparatus 32, and the upper anti-reflection film forming apparatus 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the coating treatment apparatuses such as the developing treatment apparatus 30, the lower anti-reflection film forming apparatus 31, the resist coating apparatus 32, and the upper anti-reflection film forming apparatus 33, for example, spin coating of applying a predetermined treatment solution onto the wafer W is performed. In the spin coating, the treatment solution is discharged, for example, from a coating nozzle onto the wafer W and the wafer W is rotated to diffuse the treatment solution over the front surface of the wafer W.

For example, in the second block G2, as illustrated in FIG. 3, thermal treatment apparatuses 40 each of which performs thermal treatments such as heating and cooling on the wafer W, adhesion apparatuses 41 each for enhancing adhesion between the resist solution and the wafer W, and edge exposure apparatuses 42 each of which exposes the outer peripheral portion of the wafer W, are provided side by side in the vertical direction and in the horizontal direction. The numbers and the arrangement of the thermal treatment apparatuses 40, the adhesion apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm 100a that is movable, for example, in the X-direction, the θ-direction, and the vertical direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm 110a that is movable, for example, in the Y-direction, the θ-direction, and the vertical direction. The wafer transfer apparatus 110 can transfer the wafer W to/from each of the delivery apparatuses in the fourth block G4, the delivery apparatus 111, and the exposure apparatus 12, for example, while supporting the wafer W by the transfer arm 110a.

In the above substrate treatment system 1, a control unit U is provided as illustrated in FIG. 1. The control unit U is, for example, a computer and includes a program storage unit (not illustrated). In the program storage unit, a program for controlling the treatments on the wafer W in the substrate treatment system 1 is stored. Note that the program may be the one that is recorded, for example, in a computer-readable storage medium H such as a computer-readable hard disk (HD), flexible disk (FD), compact disk (CD), magneto-optical disk (MO), or memory card, and installed from the storage medium into the control unit U.

<Wafer Treatment>

Next, the wafer treatment performed using the substrate treatment system 1 configured as described above will be described.

First, a cassette C housing a plurality of wafers W is transferred into the cassette station 10 of the substrate treatment system 1 and mounted on the cassette mounting plate 21. Then, each of the wafers W in the cassette C is successively taken out by the wafer transfer apparatus 23 and transferred to the delivery apparatus 53 in the third block G3 in the treatment station 11.

Then, the wafer W is transferred by the wafer transfer apparatus 70 to the thermal treatment apparatus 40 in the second block G2 and subjected to a temperature adjustment treatment. Thereafter, the wafer W is transferred by the wafer transfer apparatus 70, for example, to the lower anti-reflection film forming apparatus 31 in the first block G1, in which a lower anti-reflection film is formed on the wafer W. The wafer W is thereafter transferred to the thermal treatment apparatus 40 in the second block G2 and subjected to a heat treatment. The wafer W is then returned to the delivery apparatus 53 in the third block G3.

Next, the wafer W is transferred by the wafer transfer apparatus 100 to the delivery apparatus 54 in the same third block G3. Thereafter, the wafer W is transferred by the wafer transfer apparatus 70 to the adhesion apparatus 41 in the second block G2 and subjected to a hydrophobic treatment.

Thereafter, the wafer W is transferred by the wafer transfer apparatus 70 to the resist coating apparatus 32, in which a resist film is formed on the wafer W. The wafer W is then transferred by the wafer transfer apparatus 70 to the thermal treatment apparatuses 40 and subjected to a pre-baking treatment. The wafer W is then transferred by the wafer transfer apparatus 70 to the delivery apparatus 55 in the third block G3.

Next, the wafer W is transferred by the wafer transfer apparatus 70 to the upper anti-reflection film forming apparatus 33, in which an upper anti-reflection film is formed on the wafer W. The wafer W is then transferred by the wafer transfer apparatus 70 to the thermal treatment apparatus 40, and heated and temperature-adjusted. The wafer W is then transferred to the edge exposure apparatus 42 and subjected to edge exposure processing.

Thereafter, the wafer W is transferred by the wafer transfer apparatus 70 to the delivery apparatus 56 in the third block G3.

Next, the wafer W is transferred by the wafer transfer apparatus 100 to the delivery apparatus 52, and transferred by the shuttle transfer apparatus 80 to the delivery apparatus 62 in the fourth block G4. The wafer W is then transferred by the wafer transfer apparatus 110 in the interface station 13 to the exposure apparatus 12 and subjected to exposure processing in a predetermined pattern.

Then, the wafer W is transferred by the wafer transfer apparatus 110 to the delivery apparatus 60 in the fourth block G4. The wafer W is then transferred by the wafer transfer apparatus 70 to the thermal treatment apparatus 40 and subjected to a post-exposure baking treatment. The wafer W is then transferred by the wafer transfer apparatus 70 to the developing treatment apparatus 30 and subjected to a developing treatment. After the developing treatment is finished, the wafer W is transferred by the wafer transfer apparatus 70 to the thermal treatment apparatus 40 and subjected to a post-baking treatment. The wafer W is then transferred to the cassette C on the cassette mounting plate 21, with which a series of photolithography step is completed.

Figure 4:
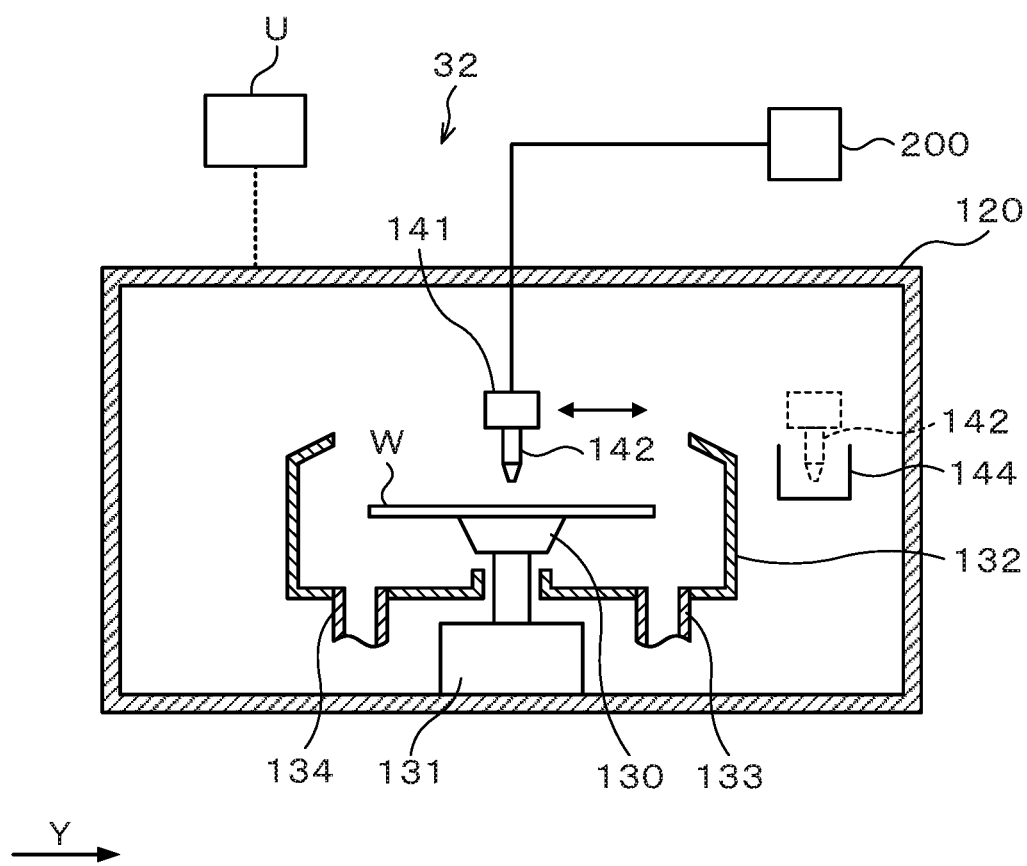
FIG. 4 is a longitudinal sectional view illustrating the outline of the configuration of a resist coating apparatus.
Figure 5:
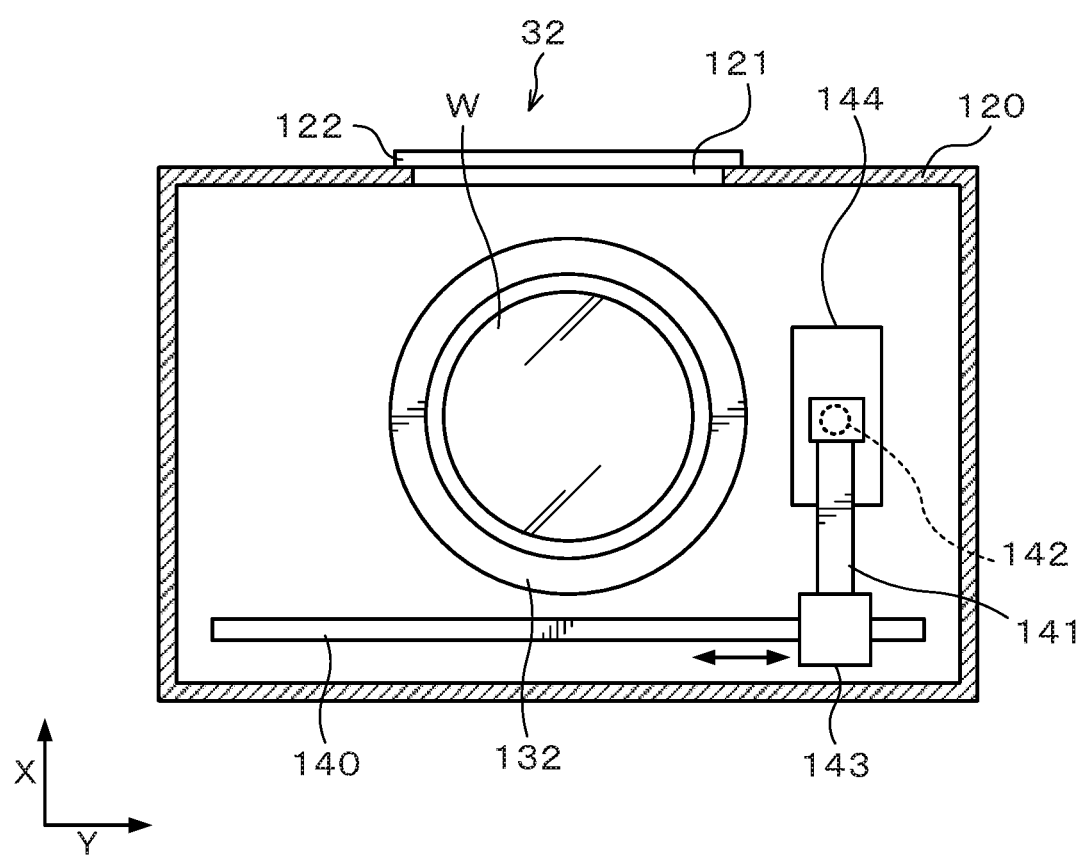
FIG. 5 is a transverse sectional view illustrating the outline of the configuration of the resist coating apparatus.

Subsequently, the configuration of the above-described resist coating apparatus 32 will be described. FIG. 4 is a longitudinal sectional view illustrating the outline of the configuration of the resist coating apparatus 32. FIG. 5 is a transverse sectional view illustrating the outline of the configuration of the resist coating apparatus 32.

The resist coating apparatus 32 has a treatment container 120 whose inside can be closed as illustrated in FIG. 4. A side surface of the treatment container 120 is formed with a transfer-in/out port 121 for the wafer W, and an open/close shutter 122 is provided at the transfer-in/out port 121 as illustrated in FIG. 5.

At the center portion in the treatment container 120, a spin chuck 130 is provided which holds and rotates the wafer W thereon as illustrated in FIG. 4. The spin chuck 130 has a horizontal upper surface, and the upper surface is provided with, for example, a suction port (not illustrated) for sucking the wafer W. By suction through the suction port, the wafer W can be suction-held on the spin chuck 130.

The spin chuck 130 has a chuck drive mechanism 131 equipped with, for example, a motor or the like and can rotate at a predetermined speed by the chuck drive mechanism 131. Further, the chuck drive mechanism 131 is provided with a raising and lowering drive source such as a cylinder so that the spin chuck 130 can freely move up and down.

Around the spin chuck 130, a cup 132 is provided which receives and collects liquid splashing or dropping from the wafer W. A drain pipe 133 that drains the collected liquid and an exhaust pipe 134 that exhausts the atmosphere in the cup 132 are connected to the lower surface of the cup 132.

As illustrated in FIG. 5, on an X-direction negative direction (lower direction in FIG. 5) side of the cup 132, a rail 140 is formed which extends along a Y-direction (right-left direction in FIG. 5). The rail 140 is formed, for example, from a Y-direction negative direction (left direction in FIG. 5) side outer position to a Y-direction positive direction (right direction in FIG. 5) side outer position of the cup 132. To the rail 140, an arm 141 is attached.

On the arm 141, a coating nozzle 142 which discharges the resist solution is supported as illustrated in FIG. 4 and FIG. 5. The arm 141 is movable on the rail 140 by means of a nozzle drive unit 143 illustrated in FIG. 5. This allows the coating nozzle 142 to move from a waiting section 144 set at the Y-direction positive direction side outer position of the cup 132 to a position above the center portion of the wafer W in the cup 132, and further move in a radius direction of the wafer W above the front surface of the wafer W. Further, the arm 141 freely rises and lowers by means of the nozzle drive unit 143 to be able to adjust the height of the coating nozzle 142. The coating nozzle 142 is connected to a resist solution supply apparatus 200 which supplies the resist solution as illustrated in FIG. 4.

Figure 6:
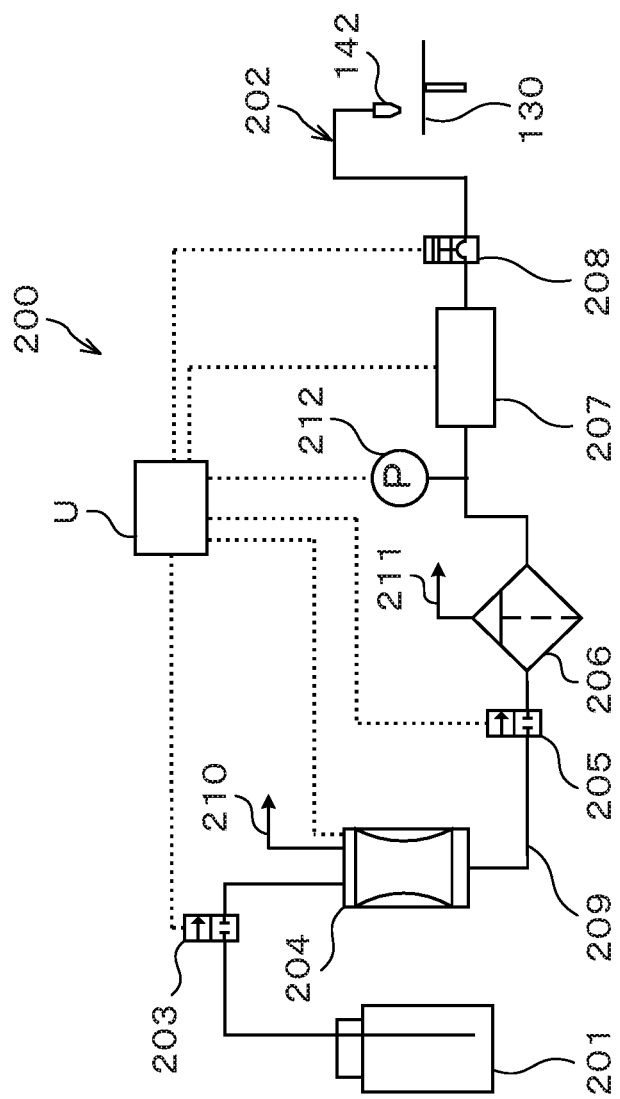
FIG. 6 is an explanatory diagram illustrating the outline of the configuration of a resist solution supply apparatus according to a first embodiment.

Next, the configuration of the resist solution supply apparatus 200 which supplies the resist solution to the coating nozzle 142 as a treatment solution discharge unit in the resist coating apparatus 32 will be described. FIG. 6 is an explanatory diagram illustrating the outline of the configuration of the resist solution supply apparatus 200. Note that, for example, a portion of the resist solution supply apparatus 200 from a later-described resist solution supply source 201 to a pump 207 is provided in a not-illustrated chemical chamber. The chemical chamber is for supplying various treatment solutions to the coating treatment apparatuses.

The resist solution supply apparatus 200 includes a resist solution supply source (hereinafter, "supply source") 201 which stores the resist solution as the treatment solution therein, and a supply path 202 which connects the supply source 201 and the coating nozzle 142.

The supply path 202 is provided with, as structures, a supply valve 203, a buffer tank 204, an opening/closing valve 205, a filter 206, a pump 207, and a suck-back valve 208 in order from the upstream side. Further, on the supply path 202, a supply pipe 209 connects the supply source 201 and the supply valve 203, connects the suck-back valve 208 and the coating nozzle 142, and connects the structures.

The supply valve 203 is configured to open/close a flow path connecting the supply source 201 and the buffer tank 204.

The buffer tank 204 is configured to temporarily store, in a not-illustrated storage chamber, a resist solution transported from the replaceable supply source 201, and is composed of, for example, a tubephragm pump. The buffer tank 204 can supply the resist solution stored in the buffer tank 204 to the coating nozzle 142 also during replacement of the supply source 201 when the resist solution in the supply source 201 ran out. At an upper portion of the buffer tank 204, a drain pipe 210 for use in draining the resist solution in the buffer tank 204 is provided. Note that a not-illustrated drain valve is provided at the drain pipe 210.

The opening/closing valve 205 is provided on the upstream side of the filter 206 and configured to open/close the flow path connecting the buffer tank 204 and the filter 206, and is composed of, for example, an air operated valve.

The filter 206 collects and removes foreign substances in the resist solution. At an upper part of the filter 206, a drain pipe 211 is provided which exhausts gas (air bubbles) generated in the resist solution.

The pump 207 is configured to send the resist solution to the coating nozzle 142 and is composed of a tubephragm pump. The resist solution sent by the pump 207 is stored in a not-illustrated storage chamber. The storage chamber constitutes a part of the flow path connecting the supply source 201 and the coating nozzle 142 and is filled with the resist solution. Note that the supply pipe 209 connecting the pump 207 and the filter 206 is provided with a pressure sensor 212. The supply pipe 209 connecting the pump 207 and the filter 206 communicates with the storage chamber of the pump 207, and the pressure in the supply pipe 209, namely, the pressure in the storage chamber of the pump 207 is measured by the pressure sensor 212.

The suck-back valve 208 is configured to cause a volume fluctuation in the flow path between the pump 207 and the coating nozzle 142. Operating the suck-back valve 208 during discharge of the resist solution from the coating nozzle 142 can suspend the discharge from the coating nozzle 142.

Figure 7:
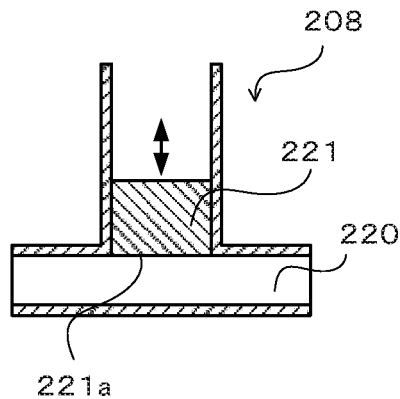
FIG. 7 is a sectional view simplistically illustrating the configuration of a suck-back valve.

FIG. 7 is a cross-sectional view simplistically illustrating the configuration of the suck-back valve 208.

The suck-back valve 208 in FIG. 7 is provided with a flow path 220 constituting the part of a resist solution flow path which connects the supply source 201 and the coating nozzle 142 and is filled with the resist solution. Further, the suck-back valve 208 is provided with a rod 221 movable in the vertical direction in the drawing. A lower surface 221a of the rod 221 is exposed to the flow path 220. The suck-back valve 208 is configured such that when it is operated, the rod 221 rises to increase the volume of the flow path 220.

The description is returned to FIG. 6.

In the resist solution supply apparatus 200, the supply valve 203, the buffer tank 204, the opening/closing valve 205, the pump 207, the suck-back valve 208 and so on are controlled by the above-described control unit U. Further, the measurement result by the pressure sensor 212 is outputted to the control unit U.

Figure 8:
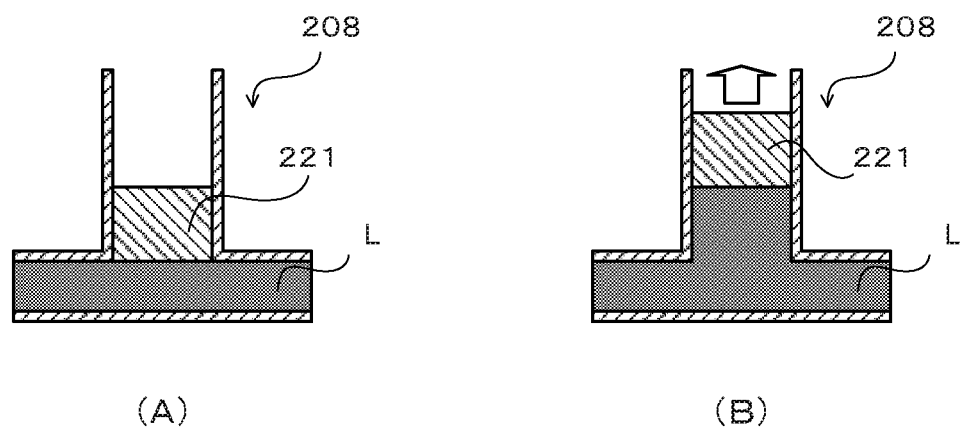
FIG. 8 explains a resist solution supply treatment by the resist solution supply apparatus according to the first embodiment.
Figure 8:
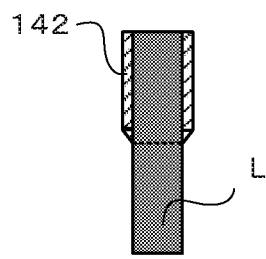
Figure 8:
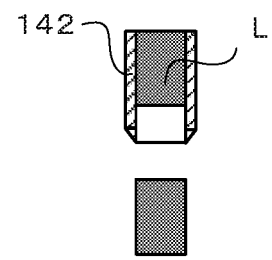

Next, a resist solution supply treatment by the resist solution supply apparatus 200 will be described using FIG. 8. FIG. 8 is an explanatory view of a discharge suspension treatment included in the resist solution supply treatment. FIG. 8(A) and FIG. 8(B) illustrate the motion of the suck-back valve 208 before and after the discharge suspension of the resist solution, and FIG. 8(C) and FIG. 8(D) are views illustrating the appearance of the discharge from the coating nozzle 142 before and after the discharge suspension.

(Replenishing the Buffer Tank 204)

In the resist solution supply treatment, first, the supply valve 203 is brought into an open state and the storage chamber of the buffer tank 204 is reduced in pressure on the basis of the control signals from the control unit U, whereby the resist solution is supplied from the supply source 201 to the storage chamber of the buffer tank 204 and replenished.

(Replenishing the Pump 207)

After the storage chamber of the buffer tank 204 is replenished with a predetermined amount of the resist solution, the supply valve 203 is brought into a closed state, and the opening/closing valve 205 is brought into an open state. Concurrently, while the pressure in the storage chamber of the pump 207 is kept at the atmospheric pressure, a pressure is applied on the storage chamber of the buffer tank 204 with respect to the atmospheric pressure to pressure-feed the resist solution in the storage chamber of the buffer tank 204 toward the pump 207. The pressure-fed resist solution passes through the filter 206, and is then transported to the storage chamber of the pump 207. Note that the control unit U thereafter performs a positive pressure holding control on the storage chamber of the buffer tank 204 at all times. More specifically, the control unit U performs a control on the basis of the measurement result by the pressure sensor 212 so that the pressure in the storage chamber of the buffer tank 204 is higher than the pressure in the storage chamber of the pump 207 at all times.

After the storage chamber of the pump 207 is replenished with a predetermined amount of the resist solution, the opening/closing valve 205 is brought into a closed state to finish the replenishing the pump 207 with the resist solution. Further, the amount of the resist solution to be pressure-fed from the buffer tank 204 is previously determined so as to prevent the resist solution pressure-fed from leaking from the coating nozzle 142 through the pump 207 during the replenishing the pump 207 with the resist solution.

(Discharge Start)

In discharging from the coating nozzle 142, the storage chamber of the pump 207 is brought into a pressurized state with respect to the atmospheric pressure with the opening/closing valve 205 kept in the open state. This pressure-feeds the resist solution in the pump 207 from the pump 207 toward the coating nozzle 142, and starts discharge of the resist solution from the coating nozzle 142 to the wafer W. Note that in this event, the pressure in the storage chamber of the buffer tank 204 is controlled to be higher than the pressure in the storage chamber of the pump 207 on the basis of the measurement result by the pressure sensor 212. This enables replenishment of an amount of the resist solution corresponding to that discharged from the pump 207, from the buffer tank 204.

(Discharge Suspension)

When the predetermined amount of the resist solution is discharged from the coating nozzle 142 and the predetermined amount of the resist solution is pressure-fed from the pump 207, the suck-back valve 208 is controlled and operated in the resist solution supply apparatus 200. Specifically, for example, the rod 221 of the suck-back valve 208 located on the lower side as in FIG. 8(A) is raised as in FIG. 8(B) to increase the volume of the flow path 220 (see FIG. 7) filled with a resist solution L. This suspends the discharge of the resist solution from the coating nozzle 142. In other words, the state where the resist solution is being discharged from the coating nozzle 142 as in FIG. 8(C) is instantaneously switched to the state where the resist solution is not discharged as in FIG. 8(D).

Further, the suck-back valve 208 is operated as in the above, and a control signal for stopping the pressure feed of the resist solution from the pump 207 (hereinafter, a stop control signal) is sent from the control unit U to the pump 207 to control to make the pressure in the storage chamber of the pump 207 the atmospheric pressure. Note that either of the sending timing of the stop control signal and the timing of operating the suck-back valve 208 may be earlier or both of them may be the same. However, it is preferable that the latter timing is earlier or the same.

(Stop of Discharge of the Resist Solution)

In the resist solution supply apparatus 200, after the stop control signal is sent and while the discharge from the coating nozzle 142 is suspended due to the operation of the suck-back valve 208, the opening/closing valve 205 is controlled into a closed state. This completely stops the discharge from the coating nozzle 142.

According to this embodiment, the opening/closing valve 205 is provided on the upstream side of the filter 206, so that even if a minute amount of foreign substances is generated at the opening/closing valve 205, the foreign substances can be removed by the filter 206. Therefore, the resist solution with less foreign substances can be supplied to the coating nozzle 142.

Note that examples of the method of stopping the discharge from the coating nozzle 142 in the resist solution supply apparatus having a configuration in which the suck-back valve 208 is omitted from the configuration of the above-described resist solution supply apparatus 200 include the following methods (1) and (2).
(1) A method of stopping the pressure feed from the pump 207 and the buffer tank 204 with the opening/closing valve 205 kept in the open state (namely, a method of bringing the pressure in the storage chambers of the pump 207 and the buffer tank 204 to the atmospheric pressure with the opening/closing valve 205 kept in the open state).
(2) A method of stopping the pressure feed from the pump 207 and bringing the opening/closing valve 205 into a closed state.

However, in the method of the above (1), it takes time from transmission of the stop control signal for stopping the pressure feed to completion of the stop of the sending of the resist solution to the resist solution from the pump 207 and the buffer tank 204. Therefore, the method of the above (1) is poor in liquid draining property at the coating nozzle 142. Note that "poor in liquid draining property" means that the flow of the liquid cannot be completely stopped at desired timing, and "good in liquid draining property" means that the flow of the liquid can be completely stopped at desired timing. If the liquid draining property at the coating nozzle 142 is poor, a desired resist film cannot be obtained in the resist coating apparatus 32.

Besides, in the method of the above (2), it takes time from transmission of the stop control signal for stopping the pressure feed to completion of the stop of the sending of the resist solution to the resist solution from the pump 207 as in the case of the above (1). Further, if the stop of the sending of the resist solution is completed immediately after the transmission of the stop control signal, the flow of the resist solution in the flow path to which the pressure from the buffer tank 204 is applied cannot be immediately stopped due to the inertial force applied on the resist solution even after the opening/closing valve 205 is closed because the volume/mass of the flow path from the opening/closing valve 205 to the coating nozzle 142 is large. Therefore, the method of the above (2) is poor in liquid draining property at the coating nozzle 142.

In contrast to the above, in the resist solution supply apparatus 200 of this embodiment, together with the control of stopping the pressure feed of the resist from the pump 207, namely, the control of transmitting the stop control signal for stopping the pressure feed, the following control is performed. More specifically, the control of suspending the discharge of the resist solution from the coating nozzle 142 by the operation of the suck-back valve 208, and then bringing the opening/closing valve 205 into a closed state to completely stop the discharge of the resist solution from the coating nozzle 142, is performed.

Accordingly, the resist solution flowed from the pump 207 after the transmission of the stop control signal until the stop of the sending of the resist solution from the pump 207 can be stored in the flow path increasing in volume by the operation of the suck-back valve 208. Further, the resist solution moved to the upstream side of the pump 207 due to the inertial force after the opening/closing valve 205 is closed can also be stored in the flow path increasing in volume by the operation of the suck-back valve 208. Accordingly, the resist solution supply apparatus 200 of this embodiment is good in liquid draining property at the coating nozzle 142.

Next, a liquid level holding treatment possibly included in the resist solution supply treatment of the resist solution supply apparatus 200 will be described.

Even if the control of stopping the discharge of the resist solution from the coating nozzle 142 as in the resist solution supply apparatus 200 of this embodiment is performed, there is a following problem if the time from the transmission of the stop control signal for stopping the pressure feed to the pump 207 until the completion of the stop of the sending of the resist solution from the pump 207 is long. Specifically, there may be a case where the resist solution flowing out of the pump 207 during the above time cannot be completely stored in the flow path increased in volume by the operation of the suck-back valve 208. Besides, even if the above resist solution can be completely stored, the liquid level of the resist solution in the coating nozzle 142 when the discharge of the resist solution is stopped may be held at a position displaced from the predetermined position. The liquid level of the resist solution in the coating nozzle 142 is preferably located, for example, inside by 2 to 3 mm from the tip of the coating nozzle 142.

Accordingly, the resist solution supply treatment in the resist solution supply apparatus 200 may include the liquid level holding treatment, namely, the treatment for holding the liquid level of the resist solution in the coating nozzle 142 when the discharge of the resist solution is stopped, at the predetermined position.

(One Example of the Liquid Level Holding Treatment)

In the liquid level holding treatment, the pump 207 is controlled to suck a predetermined amount of the resist solution. More specifically, for example, to stop the discharge of the resist solution from the coating nozzle 142, the stop control signal is transmitted to the pump 207 and the suck-back valve 208 is controlled to operate, and then the treatment of controlling the pump 207 to keep the storage chamber of the pump 207 in the pressure-reduced state for a predetermined time is performed as the liquid level holding treatment. This returns a predetermined amount of the resist solution in the supply path 202 on the downstream side of the pump 207 to the pump 207. Thus, the liquid level of the resist solution in the coating nozzle 142 when the discharge of the resist solution is stopped can be held at the predetermined position.

Note that the liquid level holding control performed in the liquid level holding treatment in this example may be performed either before or after the control of bringing the opening/closing valve 205 into the closed state as long as it is no earlier than the control of operating the suck-back valve 208.

(Another Example of the Liquid Level Holding Treatment)

In another example of the liquid level holding treatment, the buffer tank 204 composed of the tubephragm pump is controlled to suck a predetermined amount of the resist solution. More specifically, for example, to stop the discharge of the resist solution from the coating nozzle 142, the stop control signal is transmitted to the pump 207 and the suck-back valve 208 is controlled to operate, and then the treatment of controlling the buffer tank 204 to keep the storage chamber of the buffer tank 204 in the pressure-reduced state for a predetermined time with the opening/closing valve 205 kept in the open state is performed as the liquid level holding treatment. This returns a predetermined amount of the resist solution in the supply path 202 on the downstream side of the buffer tank 204 to the buffer tank 204. Thus, the liquid level of the resist solution in the coating nozzle 142 when the discharge of the resist solution is stopped can be held at the predetermined position.

Note that the liquid level holding control performed in the liquid level holding treatment in this example is performed no earlier than the control of operating the suck-back valve 208 and before the control of bringing the opening/closing valve 205 into the closed state.

Second Embodiment

Figure 9:
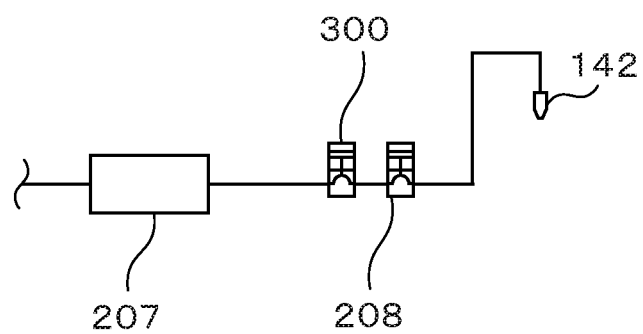
FIG. 9 is a diagram illustrating an essential part of a resist solution supply apparatus according to a second embodiment.

FIG. 9 is a diagram illustrating an essential part of a resist solution supply apparatus according to a second embodiment.

In the resist solution supply apparatus in FIG. 9, different from the resist solution supply apparatus 200 in FIG. 6, a suck-back valve 300 is provided on the downstream side of the pump 207 in addition to the suck-back valve 208. Note that the structure of the suck-back valve 300 is the same as that of the suck-back valve 208. Further, the configuration on the upstream side of the pump 207 in the resist solution supply apparatus of this embodiment is the same as that in FIG. 6 and therefore its illustration and the like are omitted.

In the liquid level holding treatment in the resist solution supply apparatus of this embodiment, a control is performed so that the suck-back valve 208 is operated and then a control is performed so that the suck-back valve 300 is operated. Thus, a predetermined resist solution can be stored in the flow path on the downstream side of the pump 207. Therefore, the liquid level of the resist solution in the coating nozzle 142 when the discharge of the resist solution is stopped can be held at the predetermined position.

Note that the liquid level holding control performed in the liquid level holding treatment in this example may be performed either before or after the control of bringing the opening/closing valve 205 into the closed state as long as it is no earlier than the control of operating the suck-back valve 208.

A plurality of other suck-back valves 300 may be provided as long as the number of them is one or more. Further, the other suck-back valve 300 is connected in series with the suck-back valve 208 in this example, but may be connected in parallel therewith.

The change amount in volume of the flow path due to the operation of the suck-back valve 300 may be the same as that of the suck-back valve 208 or may be larger or smaller than that of the suck-back valve 208. However, it is preferable that the change amount of the one of the suck-back valves 208, 300 which is operated first is the largest.

Further, when the plurality of suck-back valves are provided as in this embodiment, for example, a control is performed so that the suck-back valve 208 is operated, then a control is performed so that the buffer tank 204 and the pump 207 suck a predetermined amount of the resist solution, and thereafter a control may be performed so that the other suck-back valve 300 is operated.

Third Embodiment

Figure 10:
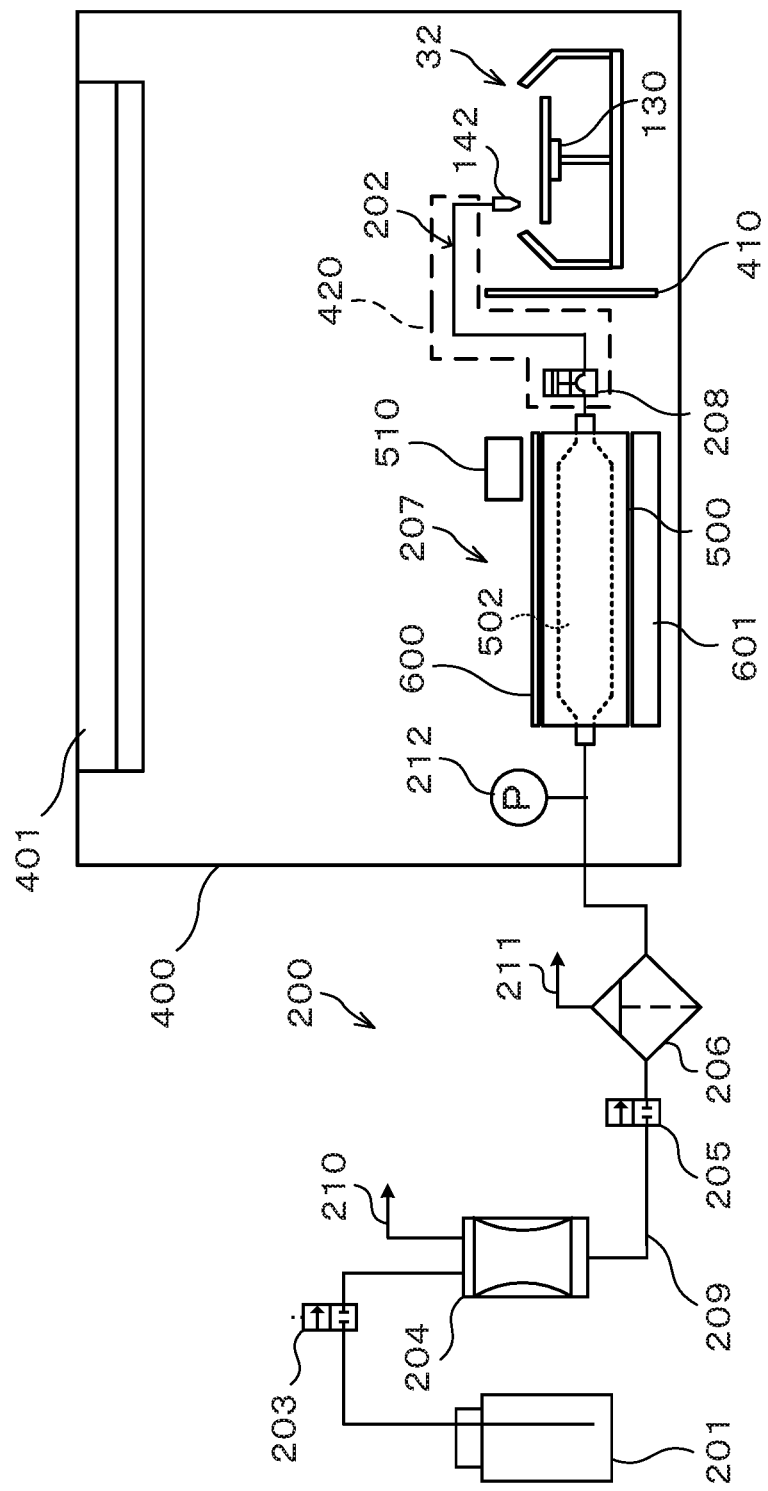
FIG. 10 is an explanatory diagram illustrating the outline of the configuration of a resist solution supply apparatus according to a third embodiment.
Figure 11:
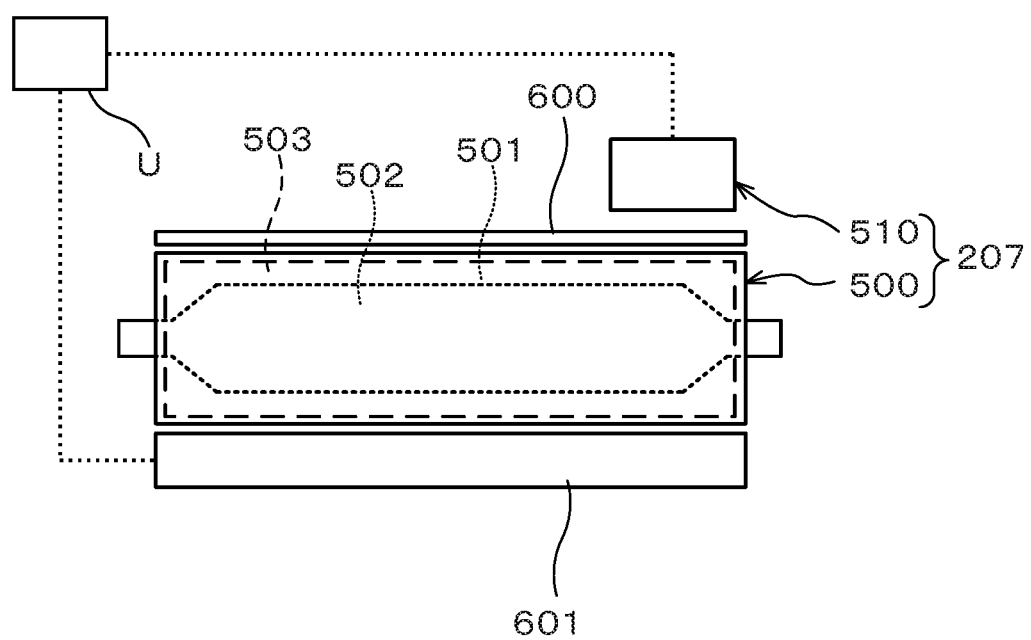
FIG. 11 is a diagram schematically illustrating the structure around a pump in the resist solution supply apparatus according to the third embodiment.

FIG. 10 is an explanatory diagram illustrating the outline of the configuration of a resist solution supply apparatus according to a third embodiment. FIG. 11 is a diagram schematically illustrating the structure around a pump 207 in the resist solution supply apparatus in FIG. 10.

A resist solution supply apparatus 200 in FIG. 10 has a part, particularly, a portion on the downstream side of the filter 206 including the pump 207 is provided in a casing 400 housing the resist coating apparatus 32.

In the casing 400, a filter 401 is provided to cover the upper surface of the casing 400. From the filter 401, clean air adjusted in temperature and humidity is supplied to manage/adjust the inside of the casing 400 to a predetermined temperature (for example, 23° C.) and a predetermined humidity.

Further, in the casing 400, a heat insulating member 410 is provided between the pump 207 and the resist coating apparatus 32 to prevent heat of a later-described motor 510 of the pump 207 from affecting the resist coating apparatus 32. Further, inside the casing 400, a pipe temperature adjusting mechanism 420 is provided which performs temperature adjustment of the resist solution in the supply path 202 on the downstream side of the pump 207.

Further, in this embodiment, the pump 207 includes a container 500 for the resist solution and the motor 510 as a drive unit as illustrated in FIG. 11.

In the container 500, a storage chamber 502 which temporarily stores the resist solution is composed of a flexible diaphragm 501. Further, in the container 500, an operating fluid filled chamber 503 which is filled with an operating oil as an operating fluid for adjusting the pressure of the resist solution in the storage chamber 502 is formed around the storage chamber 502.

The motor 510 is for adjusting the pressure of the operating oil in the operating fluid filled chamber 503 and, concretely, for driving a not-illustrated adjuster configured to adjust the pressure of the operating oil in the operating fluid filled chamber 503.

Further, in this embodiment, the resist solution supply apparatus 200 includes a heat insulating member 600 between the container 500 of the pump 207 and the motor 510. This can prevent heat generated by the motor 510 from affecting the operating oil in the container 500 and furthermore the resist solution.

Further, the resist solution supply apparatus 200 includes a temperature adjusting mechanism 601 which performs temperature adjustment of the operating oil, outside the container 500 and on the side opposite to the motor 510. The resist solution supply apparatus 200 controls the temperature adjusting mechanism 601 by the control unit U to thereby temperature-adjust the operating oil in the container 500 and thereby can control the temperature of the resist solution in the storage chamber 502.

Note that the temperature adjustment in the container 500 by the temperature adjusting mechanism can be performed using, for example, water adjusted in temperature (hereinafter, temperature adjusted water) or a Peltier element, and can be performed also by housing the container 500 in a temperature-adjusted box-shaped apparatus. Examples of the method of performing temperature adjustment using the temperature adjusted water include a method of circulating the temperature adjusted water inside a temperature-adjusting plate on which the container 500 is mounted, a method of directly immersing the container 500 in the temperature adjusted water and so on.

In this embodiment, a portion of the resist solution supply apparatus 200 on the downstream side of the filter 206 is provided in the casing 400 whose inside is temperature-adjusted. Accordingly, only by providing the heat insulating member 600 between the motor 510 of the pump 207 and the container 500, as compared with the case where the whole resist solution supply apparatus 200 is arranged outside the casing 400, the temperature adjustment of the resist solution by temperature-adjusting the operating fluid can be performed in the form of not being affected by the outside.

Further, if the temperature adjustment of the resist solution in the pump 207 is not performed, only the resist solution in the supply pipe 209 connecting the pump 207 and the coating nozzle 142 is obtained as the temperature-adjusted resist solution. Since the diameter of the supply pipe 209 is not large, the length of a portion of the supply pipe 209 where the temperature adjustment is performed needs to be increased to secure the predetermined amount or more of the temperature-adjusted resist solution. However, the length of the portion of the supply pipe 209 where the temperature adjustment is performed cannot be made a predetermined length or longer because of the standard or the like. In contrast to the above, the length of the portion of the supply pipe 209 where the temperature adjustment is performed can be decreased because the resist solution in the pump 207 is temperature-adjusted in this embodiment. Further, when the target temperature of the temperature adjustment of the resist solution is close to the managed temperature in the casing 400, the temperature adjustment in the supply pipe 209 can be omitted.

In the resist solution supply apparatus according to each of the above embodiments, a temperature adjusting mechanism for a filter performing temperature adjustment of the filter 206 may be provided. This can improve the efficiency of collecting the foreign substances by the filter 206.

Note that though the description is made using the resist solution as the treatment solution to be supplied from the treatment solution supply apparatus according to the embodiments, for example, a developing solution or the like may be supplied.

The embodiments disclosed herein should be understood to be examples and to be not restrictive in all respects. The above embodiments may be subjected to omission, replacement, and modification in various forms without departing from accompanying claims and their spirits.

What is claimed is:

1. A treatment solution supply apparatus configured to supply a treatment solution to a treatment solution discharge nozzle via a supply path, the supply path being provided with a filter configured to remove foreign substances in the treatment solution and a tubephragm pump configured to send the treatment solution,
the supply path being provided with an opening/closing valve on an upstream side of the tubephragm pump and the filter, and a suck-back valve, which is configured to cause a volume fluctuation in the supply path, on a downstream side of the tubephragm pump and the filter,
the treatment solution supply apparatus comprising a control unit, the control unit includes a computer and program storage, the computer is configured to control at least the tubephragm pump, the opening/closing valve, and the suck-back valve,
wherein the computer is further configured to perform:
a control of stopping sending of the treatment solution from the tubephragm pump; and
a control of suspending discharge of the treatment solution from the treatment solution discharge nozzle by increasing the volume of the supply path by operation of the suck-back valve, and then closing the opening/closing valve to stop the discharge.

2. The treatment solution supply apparatus according to claim 1,
wherein the computer is further configured to perform a liquid level holding control for holding a position of a liquid level of the treatment solution in the treatment solution discharge nozzle when the discharge of the treatment solution is stopped, at a predetermined position.

3. The treatment solution supply apparatus according to claim 2,
wherein the computer is further configured to control the tubephragm pump so that the tubephragm pump sucks the treatment solution in the supply path on the downstream side of the tubephragm pump in the liquid level holding control.

4. The treatment solution supply apparatus according to claim 2,
wherein the supply path is provided with another tubephragm pump configured to temporarily store the treatment solution, on an upstream side of the opening/closing valve; and
wherein the computer is further configured to control the another tubephragm pump so that the another tubephragm pump sucks the treatment solution in the supply path on a downstream side of the another tubephragm pump in the liquid level holding control.

5. The treatment solution supply apparatus according to claim 2,
wherein the supply path is provided with another suck-back valve on the downstream side of the tubephragm pump and the filter; and wherein the computer is further configured to control the another suck-back valve so that the another suck-back valve operates in the liquid level holding control.

6. The treatment solution supply apparatus according to claim 1,
wherein the tubephragm pump comprises a storage chamber configured to store the treatment solution, and an operating fluid filled chamber filled with an operating fluid for adjusting a pressure in the storage chamber,
wherein the treatment solution supply apparatus comprises a temperature adjusting mechanism configured to adjust a temperature of the operating fluid, and
wherein the computer is further configured to control a temperature of the treatment solution in the storage chamber by controlling the temperature adjusting mechanism to temperature-adjust the operating fluid.

7. The treatment solution supply apparatus according to claim 6,
wherein the tubephragm pump comprises a drive unit for adjusting a pressure to be applied to the operating fluid, and
wherein the treatment solution supply apparatus comprises a heat insulating member configured to insulate the operating fluid filled chamber from heat of the drive unit.

8. A substrate treatment system comprising the treatment solution supply apparatus according to claim 1, the substrate treatment system comprising:
a coating treatment apparatus configured to apply the treatment solution supplied from the treatment solution supply apparatus onto a treatment body via the treatment solution discharge nozzle; and
a casing configured to house the coating treatment apparatus,
wherein a portion on a downstream side of the tubephragm pump of the treatment solution supply apparatus is provided in the casing.

9. The substrate treatment system according to claim 8, further comprising:
another temperature adjusting mechanism configured to adjust a temperature of the treatment solution in the supply path on the downstream side of the tubephragm pump.

10. The substrate treatment system according to claim 8,
wherein an inside of the casing is adjusted to a predetermined temperature.

* * * * *